United States Patent [19]

Kuwahara

[11] Patent Number: 5,444,271
[45] Date of Patent: Aug. 22, 1995

[54] CONDUCTIVITY-MODULATED SEMICONDUCTOR DEVICE WITH HIGH BREAKDOWN VOLTAGE

[75] Inventor: Masashi Kuwahara, Yokohama, Japan

[73] Assignee: Kabushiki Kaisha Toshiba, Kawasaki, Japan

[21] Appl. No.: 105,630

[22] Filed: Aug. 13, 1993

[30] Foreign Application Priority Data

Aug. 15, 1992 [JP] Japan .................. 4-238931

[51] Int. Cl.$^6$ ................ H01L 21/223; H01L 29/74; H01L 27/02
[52] U.S. Cl. ..................... 257/136; 257/66; 257/70; 257/73; 257/144; 257/152; 257/270; 257/328; 257/341
[58] Field of Search ............... 257/262–264, 257/270, 328, 341, 139, 143, 144, 152, 61, 754–756, 64–66, 70, 73

[56] References Cited

U.S. PATENT DOCUMENTS

| 4,920,062 | 4/1990 | Tsunoda ............. | 257/136 |
| 5,132,766 | 7/1992 | Tihanyi et al. ...... | 257/144 |
| 5,170,239 | 12/1992 | Hagino ............... | 257/139 |
| 5,171,696 | 12/1992 | Hagino ............... | 257/288 |

FOREIGN PATENT DOCUMENTS

| 0323714 | 7/1989 | European Pat. Off. ..... | 257/139 |
| 57-120369 | 7/1982 | Japan . | |
| 1144683 | 6/1989 | Japan .................. | 257/262 |
| 27569 | 1/1990 | Japan . | |
| 3261179 | 11/1991 | Japan .................. | 257/262 |
| 468573 | 3/1992 | Japan .................. | 257/262 |

OTHER PUBLICATIONS

IEEE, 1989, G. Miller, et al., "A New Concept for a Non Punch Through IGBT with MOSFET Like Switching Characteristics", pp. 21–24.

IEEE Electron Device Letters, vol. EDL-7, No. 9, Sep. 1986, Di-Son Kuo, et al., "Optimization of Epitaxial Layers for Power Bipolar-MOS Transistor", pp. 510–512.

IEEE Electron Device Letters, vol. EDL-4, No. 12, Dec. 1983, B. J. Baliga, "Fast-Switching Insulated Gate Transistors", pp. 452–454.

Primary Examiner—Mahshid D. Saadat
Attorney, Agent, or Firm—Oblon, Spivak, McClelland, Maier, & Neustadt

[57] ABSTRACT

Base regions of a second conductivity type are formed and spaced apart from one another in a first major surface of a semiconductor substrate of a first conductivity type which functions as a drain region. Source regions of the first conductivity type are formed in each of the base regions and spaced apart from one another. Gate insulating films are formed on portions of the drain region which are located between adjacent source regions. Gates are formed on the gate insulating films. Source electrodes are formed such that each electrode short-circuits one-base region to the source regions formed in the base region. A first anode region of the second conductivity type is formed on a second major surface of the semiconductor substrate. A second anode region of the second conductivity type is formed on the first anode region. This second anode region is made of polycrystalline silicon of the second conductivity type and has an impurity concentration higher than that of the first anode region. An anode electrode is formed on the second anode region.

9 Claims, 6 Drawing Sheets

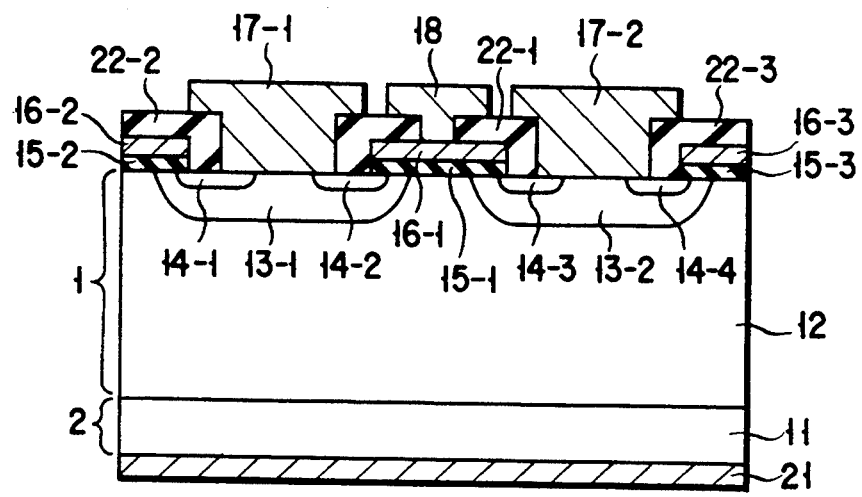
F I G. 6
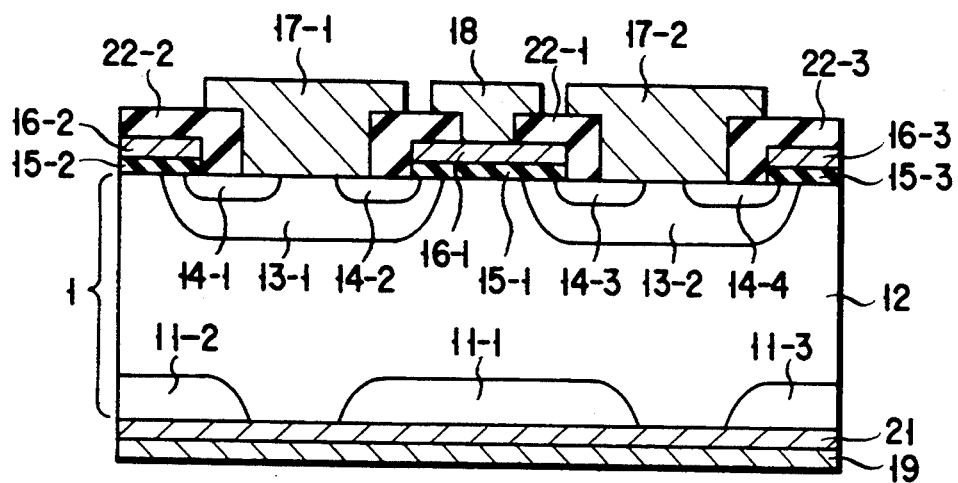
F I G. 7

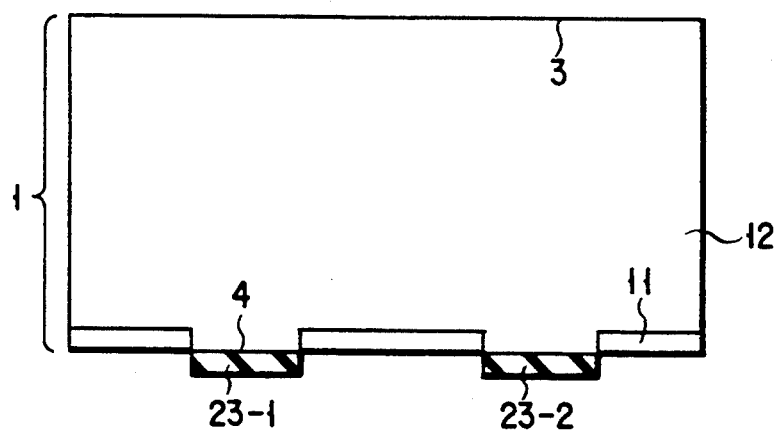
F I G. 8
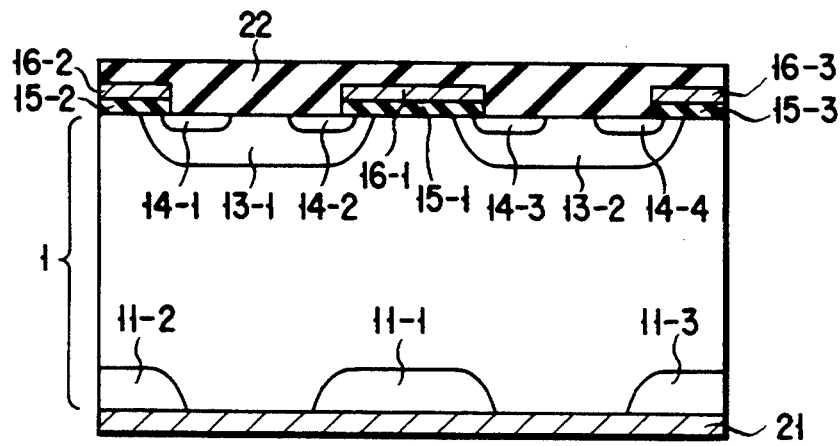
F I G. 9
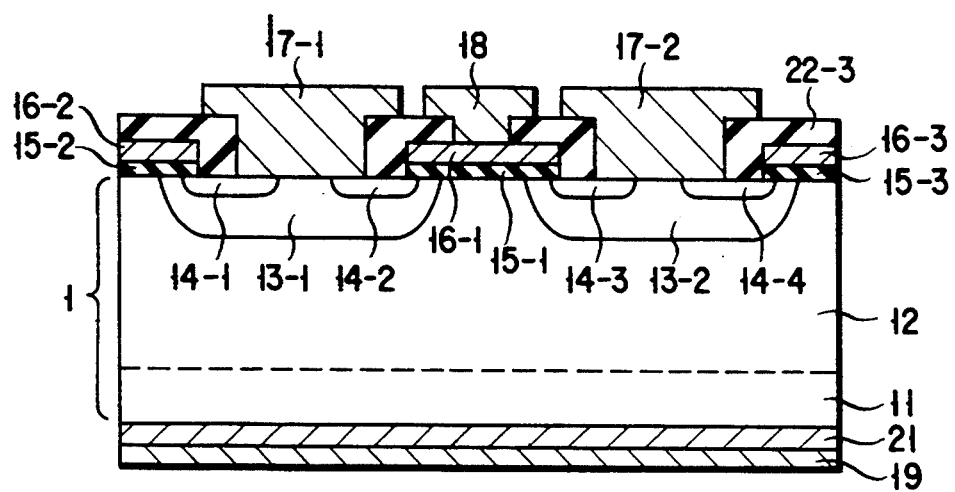
F I G. 10

CONDUCTIVITY-MODULATED SEMICONDUCTOR DEVICE WITH HIGH BREAKDOWN VOLTAGE

BACKGROUND OF THE INVENTION

1. Field of the Invention

The present invention relates to a conductivity-modulated semiconductor device and a method of manufacturing the device, and more particularly, to an IGBT (Insulated Gate Bipolar Transistor) having a breakdown voltage of 1200 V or more and also a method of manufacturing the IGBT.

2. Description of the Related Art

An IGBT is a composite-structure transistor which comprises an upper MOSFET structure and a lower bipolar transistor structure. Its basic structure and operation are detailed in, for example, Jpn. Pat. Appln. KOKAI Publication No. 57-120369.

In an ordinary MOSFET, electrons are injected into the drain region only. If the drain region is thick or has a low impurity concentration, the flow of electrons is greatly hindered. The resistance of its drain region is the largest contributor to the on-resistance of the MOSFET. In an IGBT, on the other hand, the conductivity of the drain region is modulated, and the resistance thereof is extremely low. The on-resistance of the IGBT is therefore low despite the large thickness and low impurity concentration of the drain region.

In the IGBT, however, some of the minority carriers (holes) are accumulated in the drain region as excessive minority carriers. As a consequence, the IGBT cannot be turned off until the minority carriers are expelled from the drain region, even when the voltage applied on the gate is reduced to 0 V to close the channel to turn off the IGBT. Moreover, when the IGBT is turned off, electrons would move from the drain region and through the anode region, so holes are inevitably injected into the drain region. This is why the IGBT has a turn-off time which is 10 times or more longer than that of a MOSFET, though the IGBT can pass a current which is about 10 times greater than can be passed by the MOSFET. Hence, if the IGBT is incorporated into in a switching circuit such as an inverter, the circuit cannot acquire a sufficiently high switching frequency. The IGBT can be applied but to a limited use, due to its long turn-off time.

A method of decreasing the turn-off time of an IGBT is disclosed in Baliga et al., "Fast-Switching Insulated Gate Transistors", IEEE Electron Device Letters, Vol. EDL-4, No. 12, December 1983, pp. 452-454. In this method, an electron beam is applied to the drift region of the IGBT, thereby shortening the lifetime of the minority carriers. Other methods are known, in which a radiation such as a neutron beam or gamma rays are applied, or heavy metal such as Au or Pt is diffused, to obtain the same effect of shortened lifetime of the minority carriers accumulated in the drain or anode region. Although these methods can shorten the turn-off time of an IGBT, they reduce the degree of conductivity modulation. Consequently, the IGBT fails to achieve its greatest advantage, i.e., a low on-resistance. In other words, the on-resistance of the IGBT increases, as does the turn-on voltage thereof.

Another method of decreasing the turn-off time of an IGBT is disclosed in G. Miller et al., "A New Concept for a Non-Punch-Through IGBT with MOSFET Like Switching Characteristics", IEEE, PESC 1989, Record Vol. I, Sep. 21, 1989, pp. 21–24. In this method, the impurity concentration of the P+ anode region of an IGBT is decreased in order to suppress injection of holes from the anode region into the drain region of the IGBT. If the impurity concentration of the P+ anode region is reduced, however, the contact resistance between the P+ anode region and the anode electrode, which is made of a metal such as Au, is high and non-uniform. Consequently, the on-resistance of the IGBT is high and non-uniform.

Still another method of decreasing the turn-off time of an IGBT is disclosed in Kuo et al., "Optimization of Epitaxial Layers for Power Bipolar-MOS Transistor", IEEE Electron Device Letters, Vol. EDL-7, No. 9, September 1986, pp. 510–512. This method is to increase the impurity concentration of the N+ buffer layer of an IGBT. The method does not seem to reduce the turn-off time of the IGBT as much as desired. The existing vapor-phase growth (or CVD) method cannot form a stable buffer layer since it is impossible to reliably control the growth of the layer if the layer has a high impurity concentration. To be specific, the impurity in the N+ buffer is diffused into the N− drain region due to the thermal hysteresis during the manufacture of the IGBT. As a result, the N+ buffer layer will have a high impurity concentration and a large thickness, making it difficult to sufficiently reduce the turn-off time of the IGBT. In addition, to acquire a high voltage of 1200 V or more, an IGBT needs to have an N− drain region which has a low impurity concentration (about $5 \times 10^{13}/cm^3$) and a large thickness (100 μm or more). The existing vapor-phase growth method, however, cannot reliably form such a drain region.

Another method of decreasing the turn-off time of an IGBT is disclosed in Jpn. Pat. Appln. KOKAI Publication No. 2-7569. The method is characterized in two respects. First, a double-diffused drain MOS structure is formed in one of the major surfaces of an $N^{31}$ semi-conductor substrate having a low impurity concentration. Second, impurity ions are implanted into the other major surface of the substrate, forming a P+ anode region therein. In the structure thus formed, however, the P+ anode region has a small diffusion depth, providing a shallow PN junction of only about 1 μm. Being so thin, the PN junction is easily affected by the surface conditions of the substrate. The characteristics of the IGBT, therefore, cannot be stable.

SUMMARY OF THE INVENTION

Accordingly, it is a first object of the present invention to provide a conductivity-modulated semiconductor device which has a short turn-off time though its on-resistance and turn-on voltage are relatively low.

It is a second object of the invention to provide a conductivity-modulated semiconductor device which has stable characteristics.

It is a third object of this invention to provide a conductivity-modulated semiconductor device which has a low turn-on voltage and a high switching speed.

It is a fourth object of the present invention to provide a method of manufacturing a conductivity-modulated semiconductor device which has a short turn-off time though its on-resistance and turn-on voltage are relatively low.

It is a fifth object of the invention to provide a method of manufacturing a conductivity-modulated semi-conductor device which has stable characteristics.

It is a sixth object of this invention to provide a method of manufacturing a conductivity-modulated semi-conductor device, with ease and at low cost.

To attain the first, second, and third objects according to the invention, there is provided a conductivity-modulated semiconductor device which comprises: a semiconductor substrate of a first conductivity type, having first and second major surfaces and functioning as a drain region; a plurality of base regions of a second conductivity type, formed in the first major surface of the semiconductor substrate and spaced apart from one another; a plurality of source regions of the first conductivity type, formed in each of the base regions, and spaced apart from one another; gate insulating films formed on that portion of the drain region and those portions of the base regions, which are located between the adjacent two source regions formed in the respective base regions; gates formed on the respective gate insulating films; a plurality of source electrodes, each short-circuiting one base region to the source regions formed in the base region; a first anode region of the second conductivity type, contacting the second major surface of the semi-conductor substrate; a second anode region of the second conductivity type, formed on the first anode region, made of polycrystalline silicon of the second conductivity type, and has an impurity concentration higher than that of the first anode region; and an anode electrode formed on the second anode region.

In the device described of the invention, the second anode region is interposed between the anode electrode and the first anode region having a low impurity concentration, is made of polycrystalline and has a high impurity concentration. Hence, the contact resistance between the anode electrode and the second anode region is not only low but also stable. Although the carriers in the first anode region have a long lifetime, few holes are injected into the drain region from the second anode region, which is made of polycrystalline silicon. In other words, supply of holes into the drain region can be effectively suppressed, so the conductivity-modulated semiconductor device has a short turn-off time and, hence, a high Switching speed. Moreover, since the drain region is a semiconductor substrate, the lifetime of the carriers in the drain region is long, and the number of recombination centers in the drain region is small. The holes injected from the first anode region into the drain region therefore effectively contribute to the conductivity modulation, decreasing the turn-on voltage of the semiconductor device. Thus, the conductivity-modulated semiconductor device has both a low turn-on voltage and a high switching speed.

To attain the fourth, fifth, and sixth objects according to the invention, there is provided a method of manufacturing a conductivity-modulated semiconductor device. The method is comprised of the following steps: preparing a semiconductor substrate of a first conductivity type, having first and second major surfaces and functioning as a drain region; forming a first anode region of a second conductivity type, contacting the second major surface of the semiconductor substrate; forming a plurality of base regions of the second conductivity type, spaced apart from one another, in the first major surface of the semiconductor substrate; forming a plurality of source regions of the first conductivity type, spaced apart from one another, in the respective base regions; forming gate insulating films on that portion of the drain region and those portions of the base regions, which are located between the adjacent two source regions formed in the respective base regions; forming gates on the respective gate insulating films; forming a plurality of source electrodes, each short-circuiting one base region to the source regions formed in the base region; forming on the first anode region, a second anode region of the second conductivity type, which is made of polycrystalline silicon and has an impurity concentration higher than that of the first anode region; and forming an anode electrode on the second anode region.

In the method of this invention, the second anode region is interposed between the anode electrode and the first anode region having a low impurity concentration, is made of polycrystalline, and has a high impurity concentration. Hence, the contact resistance between the anode electrode and the second anode region is not only low but also stable. Although the carriers in the first anode region have a long lifetime, few holes are injected into the drain region from the second anode region made of polycrystalline silicon, since the first anode region having a low impurity concentration and the second anode region having a high impurity concentration constitute an anode region. In other words, injection of holes into the drain region can be effectively suppressed, so the conductivity-modulated semiconductor device has a short turn-off time and hence, a high switching speed. Furthermore, since the drain region is a semiconductor substrate, the lifetime of the carriers in the drain region is long, and the number of recombination centers in the drain region is small. The holes injected from the first anode region into the drain region therefore effectively contribute to the conductivity modulation, decreasing the turn-on voltage of the semiconductor device. Thus, the method can provide a conductivity-modulated semiconductor device has both a low turn-on voltage and a high switching speed. Still further, since the drain region is a semiconductor substrate, the method of the invention can be applied to manufacture a high voltage IGBT which comprises a thick drain region having a low impurity concentration and which can hardly be mass-produced by the existing vapor-phase growth method. Also, with the method of the invention it is possible to freely control the thickness and impurity concentration of the drain region. The method can, thus, manufacture conductivity-modulated semiconductor devices with ease and at low cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 to 6 are sectional views for explaining a method of manufacturing the semiconductor device shown in FIG. 1;

FIG. 7 is a sectional view showing an N-channel IGBT which is a conductivity-modulated semiconductor device according to a second embodiment of the present invention;

FIGS. 8 and 9 are sectional views showing the major components of the semiconductor device shown in FIG. 7 and explaining a method of manufacturing this device;

FIG. 10 is a sectional view showing an N-channel IGBT which is a conductivity-modulated semiconductor device according to a third embodiment of the invention, and explaining a method of manufacturing the device;

DETAILED DESCRIPTION OF THE PREFERRED EMBODIMENTS

Figure 1:
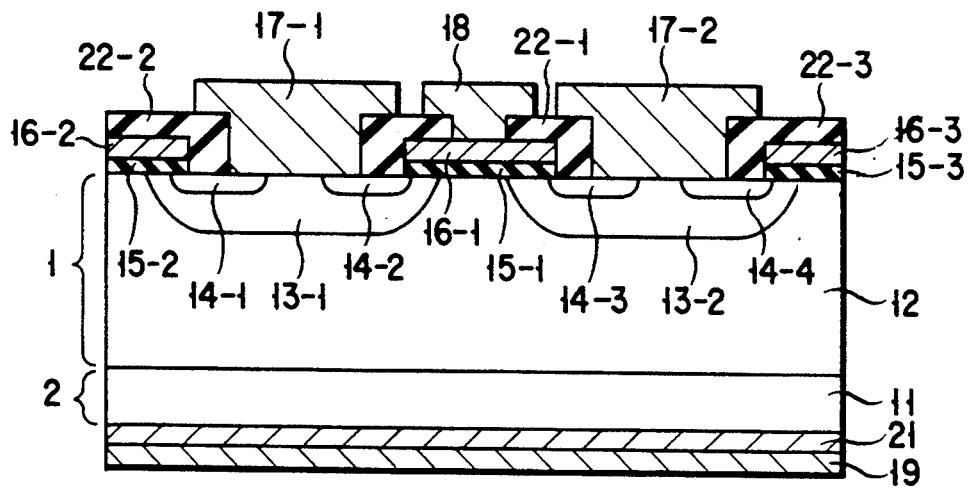
FIG. 1 is a sectional view showing an N-channel IGBT which is a conductivity-modulated semiconductor device according to a first embodiment of the present invention.
Figure 2:
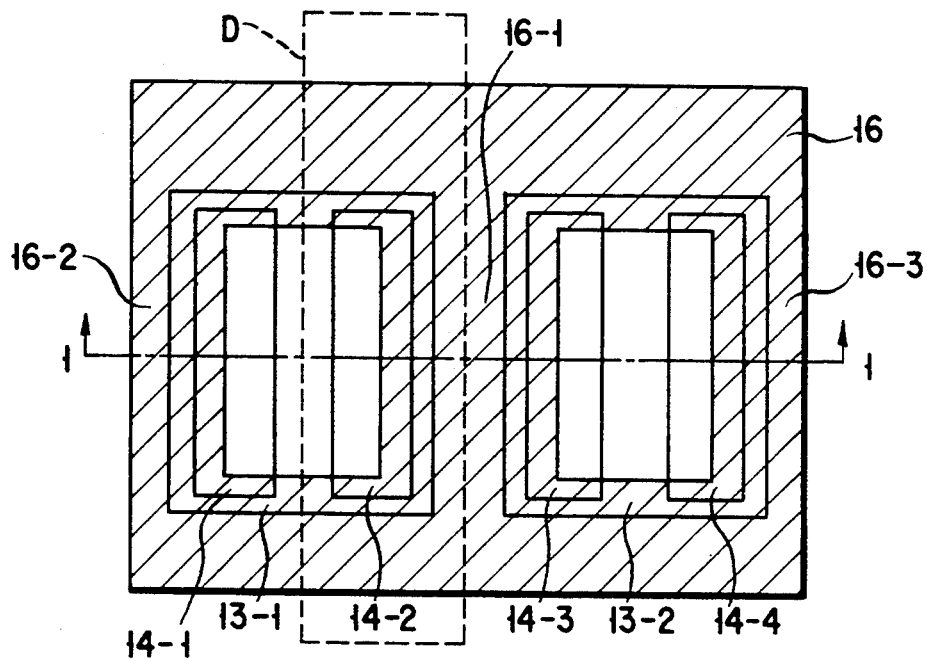
FIG. 2 is a plan view illustrating the position of the source in relation to a gate electrode of the IGBT shown in FIG. 1.

A conductivity-modulated semiconductor device according to a first embodiment of the invention, and a method of manufacturing this device will be described, with reference to FIGS. 1 to 6. FIG. 1 is a sectional view of the device which is an N-channel IGBT. FIG. 2 is a plan view showing the position of the source relative to the gate electrode of the IGBT. FIGS. 3 to 6 are sectional views for explaining the major steps of a method of manufacturing the device shown in FIG. 1.

As is shown in FIG. 1, P-type base regions 13-1 and 13-2 are formed in the first major surface 3 (upper surface) of an N−-type silicon substrate 1 and are spaced apart from each other. The substrate 1 has a thickness of about 240 to 290 μm and an impurity concentration of about $1 \times 10^{13}$ to $1 \times 10^{14}$ cm$^{-3}$; it works as an N− drain region 12.

N+ source regions 14-1 and 14-2 are formed in the surface of the P-type base region 13-1 and are spaced apart from each other. Also, N+ source regions 14-3 and 14-4 are formed in the surface of the P-type base region 13-2 and are spaced apart from each other.

A gate oxide film 15-1 is formed on that portion of the substrate 1 which lies between the N+ source regions 14-2 and 14-3. A gate 16-1 made of, for example, polycrystalline silicon, is formed on the gate oxide film 15-1.

A gate oxide film 15-2 is formed on that portion of the substrate 1 which lies between the N+ source region 14-1 and an N+ source region (not shown) located on the left side of the region 14-1. A gate 16-2 is formed on this gate oxide film 15-2. Similarly, a gate oxide film 15-3 is formed on that portion of the substrate 1 which lies between the N+ source region 14-4 and an N+ source region (not shown) located on the right side of the region 14-4. A gate 16-3 is formed on this gate oxide film 15-3.

The gates 16-1, 16-2, and 16-3 are covered with insulating films 22-1, 22-2, and 22-3, respectively. The insulating films are made of SiO$_2$ or the like. A source electrode 17-1 is formed on that portion of the substrate 1 which is exposed through a gap between the insulating films 22-1 an 22-2. Another source electrode 17-2 is formed on that portion of the substrate 1 which is exposed through a gap between the insulating films 22-1 an 22-3. Both source electrodes 17-1 and 17-2 are made of metal such as aluminum. The source electrode 17-1 short-circuits the source regions 14-1 and 14-2 to the base region 13-1. The source electrode 17-2 short-circuits the source regions 14-3 and 14-4 to the base region 13-2. The insulating film 22-1 has a through hole, through which the the gate 16-1 is exposed. A gate electrode 18 made of a metal such as aluminum is formed in the through hole and, hence, on the exposed portion of the gate 16-1.

In the second major surface (lower surface) 4 of the substrate 1, there is formed a P−-type semiconductor layer 2 by means of the vapor-phase growth method. This layer 2 has a thickness of about 10 μm and an impurity concentration of about $1 \times 10^{16}$ to $1 \times 10^{18}$ cm$^{-3}$; it functions as a P− anode region 11. A P+ anode region 21 is formed on the semiconductor layer 2. The anode region 21 is made of polycrystalline silicone heavily doped with a P-type impurity. Its impurity concentration ranges from $1 \times 10^{18}$ to $1 \times 10^{20}$ cm$^{-3}$, and its thickness is 1 μm or less, preferably ranging from 0.1 to 0.1 μm. An anode electrode 19 made of a metal such as Au is formed on the P+ anode region 21.

FIG. 2 is a plan view of the IGBT shown in FIG. 1, illustrating the gates 16-1 to 16-3, the P-type base regions 13-1 and 13-2, and the N+ source regions 14-1 to 14-4, but not showing the source electrodes 17-1 and 17-2 or the gate electrode 18. (FIG. 1 is a cross-sectional view taken along line 1-1 in FIG. 2.)

As is shown in FIG. 2, the gates 16-1 to 16-3 are formed of a single pattern 16 (the hatched area). A region G, indicated by broken-line box and located on the left side of the gate 16-1, functions as a unit element. Another unit element (not shown) is located on the right side of the gate 16-1. Similarly, a pair of unit elements are formed on both sides of every other gate. These unit elements are combined to form the IGBT, and a plurality of IGBTs are formed in a single semiconductor wafer. The IGBTs are separated from one another by cutting the semiconductor wafer. The IGBTs may be combined to form various type of circuits, such as an inverter.

The impurity Concentration of the P−-type anode region 11 is made as low as possible, and the P+ anode region 21 made of polycrystalline and having a high impurity concentration is formed on the P−-type anode region 11. Therefore, the contact resistance between the P+ anode region 21 and the anode electrode 19 is sufficiently low and stable. The impurity concentration of the P+ anode region 21 can be easily adjusted to any desired value for a specific purpose, e.g., to reduce the on-resistance, since polycrystalline silicon can be doped with impurities over a broad range of concentrations. Further, holes are generated in small numbers in P+ anode region 21, since polycrystalline silicon has low crystallinity, and holes are not supplied into the N+ drain region 12 in excessive numbers. The turn-off time of the IGBT is thereby shortened. The turn-off time is further shortened since the injection of holes into the N+ drain region 12 is suppressed despite the long lifetime of the carriers in the region 12. Thus, the IGBT has a high switching speed. Furthermore, the holes injected into the drain region 12 from the P− anode region 11 effectively contribute to the conductivity modulation because the carriers in the drain region 12 have a long lifetime and the drain region 12 has but a small number of recombination centers. As a result of this, the IGBT has a low turn-on voltage, as well as a high switching speed.

A method of manufacturing the the IGBT shown in FIG. 1 will be explained hereinafter, with reference to FIGS. 3 to 6.

Figure 3:
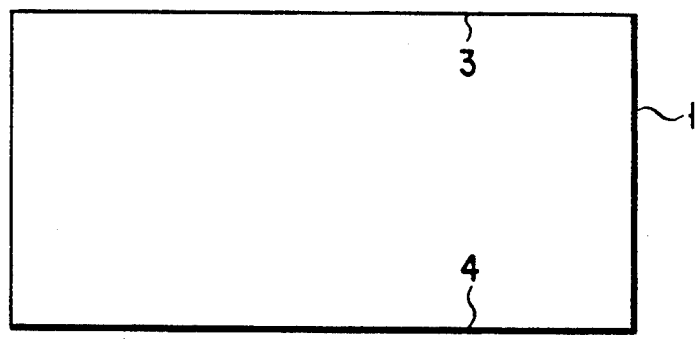
Figure 4:
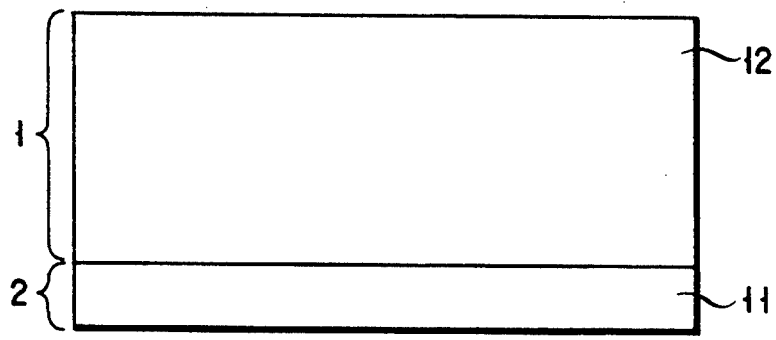

As shown in FIG. 3, an N− silicon substrate 1, doped with an N-type impurity such as phosphorus and having two major surfaces 3 and 4, is prepared. Then, as shown in FIG. 4, a single-crystal semiconductor layer 2 is formed on the second major surface 4 of the substrate 1, to a thickness of about 10 μm, by means of the vapor-phase growth method. The semiconductor layer 2 is doped with boron in a relatively low concentration of about $1 \times 10^{16}$ to $1 \times 10^{18}$ cm$^{-3}$ and functions as a P− anode region 11. Next, the first major surface 3 of the silicon substrate 1 is lapped, reducing the thickness of the substrate 1 to a desired value, and is further mirror-polished.

Figure 5:
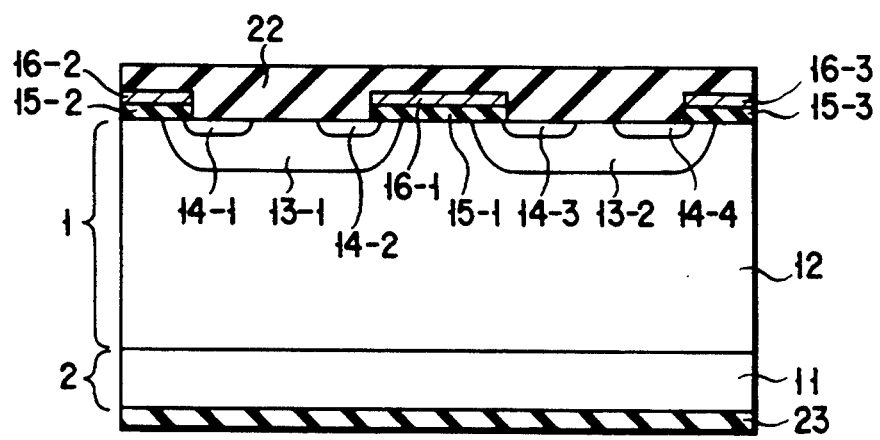

Thereafter, as can be seen from FIG. 5, a silicon oxide film 15 is formed on the first major surface 3 of the substrate 1. Further, a polycrystalline silicon layer 16 is formed on the silicon oxide film 15. The oxide film 15 and the polycrystalline silicon layer 16 are patterned, forming gate oxide films 15-1 to 15-3 and the gates 16-1 to 16-3. Using the gates 16-1 to 16-3 as mask, a P-type impurity such as boron is introduced into the substrate 1 by, for example, ion implantation, and thermally diffused therein. As a result, P-type base regions 13-1 and 13-2 are formed in the first major surface 3 of the substrate 1.

Next, using the gates 16-1 to 16-3 and a photo-resist (or a thermal oxide film) as mask, an N-type impurity such as arsenic or phosphorus is introduced into the surfaces of the P-type base regions 13-1 and 13-2 by means of, for example, ion implantation, and is then thermally diffused therein. As a result, N-type source regions 14-1 and 14-2 are formed in the surface of the P-type base region 13-1, and N-type source regions 14-3 and 14-4 are formed in the surface of the P-type base region 13-2. Subsequently, an insulating film made of silicon oxide or the like is formed on the first major surface 3 of the silicon substrate 1, and an insulating film made of silicon oxide or the like is formed on the exposed surface of the single-crystal semiconductor layer 2. Thus, an unfinished product, which has the structure illustrated in FIG. 5, is obtained.

Once the unfinished product is formed, the insulating film 23 is removed as shown in FIG. 6. A polycrystalline silicon layer 21 containing a P-type impurity such as boron in a concentration of about $1 \times 10^{18}$ to $1 \times 10^{20}$ cm$^{-3}$ is formed on the P− anode region 11 by, for example, the vapor-phase growth method. The polycrystalline silicon layer 21 functions as a P+ anode region. Next, the selected portions of the insulating film 22 are removed from the first major surface 3 of the substrate 1, by using a photoresist pattern (not shown) as mask. Portions of the base regions 13-1 and 13-2, portions of the source regions 14-1 to 14-4, and portions of the gate 16-1 are thereby exposed. A metal layer, e.g., an aluminum layer, is vapor-deposited on the surface of the resultant structure. The metal layer is patterned, forming a gate electrode 18 and source electrodes 17-1 and 17-2.

Further, an anode electrode 19 (see FIG. 1) made of, for example, Au is formed on the anode region 21. As a result, a wafer on which a number of IGBTs are formed is manufactured. The wafer is then cut into IGBT chips.

In the method described above, the drain region 12 is made of the silicon substrate 1 cut from a single-crystal silicon slab. Hence, the thickness and impurity concentration of the drain region can be freely set at any design values desired, and it can have a high voltage reaching 1700 V. Furthermore, the IGBT can be manufactured at a low cost since the anode region 11, i.e., a sole region formed by the vapor-phase growth method, is relatively thin. It should be noted that the thicker a vapor-phase grown layer, the higher the cost for forming that layer. For instance, a 1200 V IGBT according to the present invention can be manufactured at half or less the cost of the conventional 1200 V IGBT. FIG. 7 shows an N-channel IGBT, or a conductivity-modulated semiconductor device which is a second embodiment of the present invention.

This IGBT differs from the IGBT shown in FIG. 1 in that the P− anode region 11 is formed of impurity diffusion layers 11-1 to 11-3 which are formed in the second major surface 4 of the silicon substrate 1. Because of this difference, the polycrystalline silicon layer 21 (i.e., the P+ anode region) contacts the P− anode region 11 (i.e., the impurity diffusion layers 11-1 to 11-3) and the silicon substrate 1 (i.e., the drain region 12). Preferably, the impurity diffusion layers 11-1 to 11-3 have a diffusion depth of about 10 μm and an impurity concentration of about $1 \times 10^{16}$ to $1 \times 10^{18}$ cm$^{-3}$.

In the structure of FIG. 7, a good contact between the silicon substrate 1 and the anode electrode 19 can be attained since the polycrystalline silicon layer 21 having a high impurity concentration is interposed between the silicon substrate 1 and the anode electrode 19. Furthermore, since the impurity diffusion layers 11-1 to 11-3 have a small area and a low impurity concentration, holes are supplied but in small numbers into the N+ drain region 12, so the IGBT has a short turn-off time. Still further, the number of holes supplied into the N+ drain region 12 can be adjusted by changing the area ratio between the N− drain region 12, and the total P− anode regions 11-1 to 11-3 in the second major surface 4 of the substrate 1. To state it more explicitly, the smaller the total area of the regions 11-1 to 11-3, the less holes will be supplied into the N+ drain region 12, and the shorter will be the turn-off time. Conversely, the greater the total area of the regions 11-1 to 11-3, the more holes will be supplied into the N+ drain region 12, and the longer will be the turn-off time. If the turn-off time is made long, the on-resistance is reduced, thus lowering the turn-on voltage. Therefore, the IGBT can have any desired turn-off time and turn-on voltage, merely by properly adjusting the ratio of the area of the N⁻ drain region 12 to the total area of the P⁻ anode regions 11-1 to 11-3.

FIGS. 8 and 9 show the major components of the IGBT shown in FIG. 7, and explain a method of manufacturing this IGBT.

As shown in FIG. 8, an insulating film 23, e.g., a silicon oxide film, is formed on the second major surface 4 of an N⁻-type silicon substrate 1 (i.e., an N⁻ drain region 12). Then, using a mask pattern such as a photo-resist (not shown), selected portions of the insulating film 23 are etched away, patterning the film 23. Using the film 23 thus patterned, consisting of films 23-1 and 23-2, boron is ion-implanted into the second major surface 4 of the substrate 1. The boron is thermally diffused into the second major surface 4, forming P⁻ anode regions 11-1 and 11-2, each having a depth of about 10 $\mu$m. Thereafter, the structure is processed in the same way as the IGBT of FIG. 1 is manufactured, or as will be described in the following.

The first major surface 3 of the silicon substrate 1 is lapped, reducing the thickness of the substrate 1 to a desired value, and is further mirror-polished. Next, as can be seen from FIG. 9, a silicon oxide film 15 is formed on the first major surface 3 of the substrate 1. Further, a polycrystalline silicon layer 16 is formed on the silicon oxide film 15. The oxide film 15 and the polycrystalline silicon layer 16 are patterned, forming gate oxide films 15-1 to 15-3 and gates 16-1 to 16-3. Using the gates 16-1 to 16-3 as mask, a P-type impurity such as boron is introduced into the substrate 1 by, for example, ion implantation, and thermally diffused therein. As a result, P-type base regions 13-1 and 13-2 are formed in the first major surface 3 of the substrate 1.

Then, using the gates 16-1 to 16-3 and a photo-resist (or a thermal oxide film) as mask, an N-type impurity such as arsenic or phosphorus is introduced into the surfaces of the P-type base regions 13-1 and 13-2 by means of, for example, ion implantation, and is then thermally diffused therein. As a result, N-type source regions 14-1 and 14-2 are formed in the surface of the P-type base region 13-1, and N-type source regions 14-3 and 14-4 are formed in the surface of the P-type base region 13-2. Subsequently, an insulating film 22 is formed on the first major surface 3 of the silicon substrate 1, and an insulating film (not shown) is formed on the second major surface 4.

Thereafter, the insulating film 2 is removed from the second major surface 4 of the substrate 1. A polycrystalline silicon layer 21 containing a P-type impurity such as boron in a concentration of about $1 \times 10^{18}$ to $1 \times 10^{20}$ cm$^{-3}$ is formed on the P⁻ anode region 11 by, for example, the vapor-phase growth method. The polycrystalline silicon layer 21 functions as a P+ anode region. Next, the selected portions of the insulating film 22 are removed from the first major surface 3 of the substrate 1. Portions of the base regions 13-1 and 13-2, portions of the source regions 4-1 to 14-4, and portions of the gate 16-1 are thereby exposed. A metal layer, e.g., an aluminum layer, is vapor-deposited on the surface of the resultant structure. The metal layer is patterned, forming a gate electrode 18 and source electrodes 17-1 to 17-2.

Further, an anode electrode 19 made of, for example, Au is formed on the anode region 21. As a result, a wafer on which a number of IGBTs are formed is manufactured. The wafer is then cut into IGBT chips.

Since its manufacture does not use the vapor-phase growth method, which is an expensive and often times, ineffectively controlled process, the IGBT shown in FIG. 7 can be made at a low cost and can have reliable characteristics. In addition, since the silicon substrate 1 is used as a drain region, the impurity concentration of the drain region 12 can be easily set at a desired value, and the thickness of the drain region 12 can easily be adjusted by lapping the silicon substrate 1. This, too, contributes to the low manufacturing cost of the IGBT of FIG. 7. Furthermore, as indicated earlier, both the turn-off time and the turn-on voltage of this IGBT can be adjusted freely, merely by changing the ratio of the area of the drain region 12 to the total area of the anode regions 11-1 to 11-3.

FIG. 10 shows an N-channel IGBT, i.e., a conductivity-modulated semiconductor device, which is a third embodiment of the invention, and explains a method of manufacturing this N-channel IGBT.

The IGBT of FIG. 10 is characterized in that the P⁻ anode region 11 is formed by implanting impurity ions into the second major surface 4 the N⁻ silicon substrate 1. More precisely, an P-type impurity, such as boron, is ion-implanted into the second major surface 4, and thermally diffused therein at about 1100° C. for about 10 hours, thereby forming a P⁻ anode region 11 which has a depth of about 10 $\mu$m and an impurity concentration of about $1 \times 10^{16}$ cm$^{-3}$. The remaining part of the substrate 1 is used as an N⁻ drain region 12. After forming the P⁻ anode region 11, a polycrystalline silicon layer 21 having a high impurity concentration and a thickness of about 1 $\mu$m is deposited on the second major surface 4 of the substrate 1. The layer 21 thus formed is used as P+ region 21. Thereafter, gate oxide films 51-1 to 15-3 are formed on the first major surface 3 of the substrate 1, gates 16-1 to 16-3 are formed on the respective gate oxide films, P-type base regions 13-1 and 13-2 are formed in the first major surface 3, source regions 14-1 to 14-4 are formed in the base regions, insulating films 22-1 to 22-3 are formed, a gate electrode 18 and source electrodes 17-1 and 17-2 are formed, and an anode electrode 19 is formed on the anode region 21—exactly in the same way as the IGBT of FIG. 1 is manufactured.

In manufacturing the IGBT of FIG. 10, the P⁻ anode region 11 is not formed by the vapor-phase growth method which is an expensive process and which cannot be controlled well. Hence, the IGBT can be manufactured at a low cost with relative ease and skill acquire a voltage of as high as 1200 V or more.

Another conductivity-modulated semiconductor device and a method of manufacturing this device, both according to a fourth embodiment of the invention, will be described next with reference to FIGS. 11 and 12.

Figure 11:
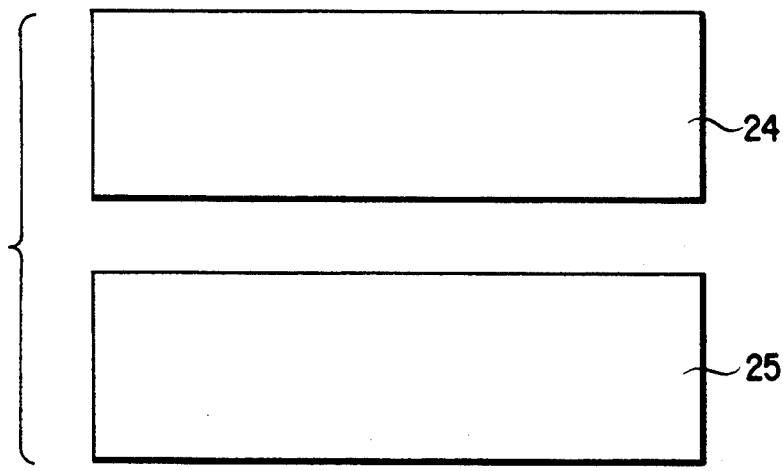
FIGS. 11 and 12 are sectional views for explaining an N-channel IGBT which is a conductivity-modulated semiconductor device according to a fourth embodiment of the invention and, also, demonstrated some of the steps of a method of manufacturing the semiconductor device.
Figure 12:
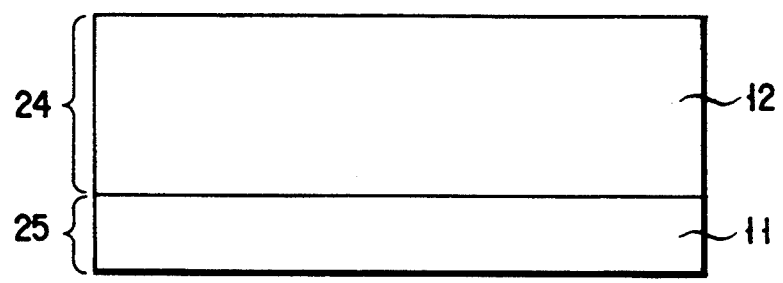

This device is made by processing a composite substrate (i.e., wafer) formed by bonding an N⁻-type silicon substrate 24 and a P⁻-type silicon substrate 25 together, as is illustrated in FIGS. 11 and 12. Active-element regions, i.e., IGBT regions, are formed in the composite substrate. How the composite substrate is made will be explained in the following.

First, that surface of the substrate 24 which is to oppose the substrate 25 or that surface of the substrate 25 which is to face the substrate 24, or both surfaces are mirror-polished. Then, the polished surface of silicon substrates 24 and 25 are placed against each other. They are heated for about 1 hour at around 1100° C. The substrates 24 and 25 are thereby bonded together, with the crystal lattices of one virtually aligned with those of the other. The exposed surface of the N⁻-type silicon substrate 24 is lapped and subsequently mirror-polished to reduce its thickness 200 to 250 μm. The N⁻-type silicon substrate 24, thus processed, forms an N⁻ drain region 12. Similarly, the exposed surface of the P⁻-type silicon substrate 25 is lapped and subsequently mirror-polished to reduce its thickness to about 10 μm. The P⁻-type silicon substrate 25, thus processed, forms a P⁻ anode region 11. Thereafter, the structure is processed in the same way as the IGBTs of FIGS. 1, 7, and 10 are manufactured, thereby producing an IGBT.

As the three previously described IGBTs, no vapor-phase growth method is performed in manufacturing the IGBT according to the fourth embodiment of the invention. Likewise, this IGBT can be manufactured easily and a at low cost. Moreover, since the drain region 12 and the anode region 11 are formed by processing two silicon substrates 24 and 25, the impurity concentration and the thickness of each can easily be adjusted to desired values.

Figure 13:
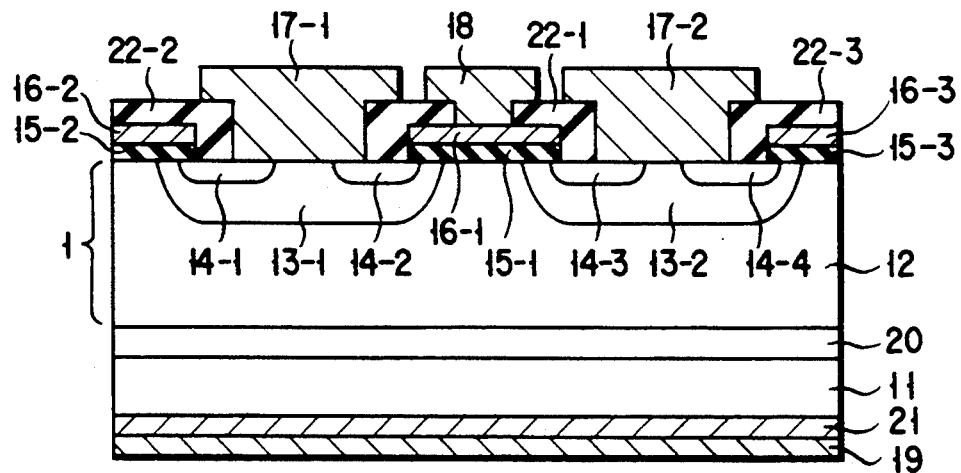
FIG. 13 is a sectional view illustrating an N-channel IGBT which is a conductivity-modulated semiconductor device according to a fifth embodiment of the invention, and explaining a method of manufacturing this semiconductor device.

FIG. 13 illustrates an N-channel IGBT, i.e., a conductivity-modulated semiconductor device according to a fifth embodiment of the invention, and also explains a method of manufacturing this N-channel IGBT.

As shown in FIG. 13, an N⁺ buffer layer 20 is formed between an N⁻ drain region 12 and a P⁻ anode region 11. An N⁻-type silicon substrate 1 works as N⁻ drain region 12. The N⁺ buffer layer 20 has been formed on the second major surface of the substrate 1 by the vapor-phase growth method. The P⁻ anode region 11 has been formed on the N⁺ buffer layer 20 by means of the vapor-phase growth method, as well. The other components of the IGBT are formed in the same way as in the manufacturing of the IGBTs of FIGS. 1, 7, and 10.

The N⁺ buffer layer 20 suppresses the moving of holes from the anode region 11 into the drain region 12. It also suppresses the development of a depletion layer from the surface of the N⁻ drain region 12. Hence, the N⁻ drain region 12 can be made thin, rendering it possible to shorten the turn-off time of the IGBT. In addition, the characteristics of the IGBT do not change much when the impurity concentration of the P⁻ anode region 11 is increased by some value. This means that the characteristics of the IGBT shown in FIG. 13 are stable and not affected by a deviation from design in the impurity concentration of the anode region 11.

In the fifth embodiment (FIG. 13), the N⁺ buffer layer 20 is formed by the vapor-phase growth method. Nonetheless, the buffer layer 20 can be formed by any other appropriate method. For example, it may be formed by implanting ions of an N-type impurity into the second major surface of the N⁻-type silicon substrate 1 and thermally diffusing the N-type impurity therein, thus forming the N⁺ buffer layer 20.

Figure 14:
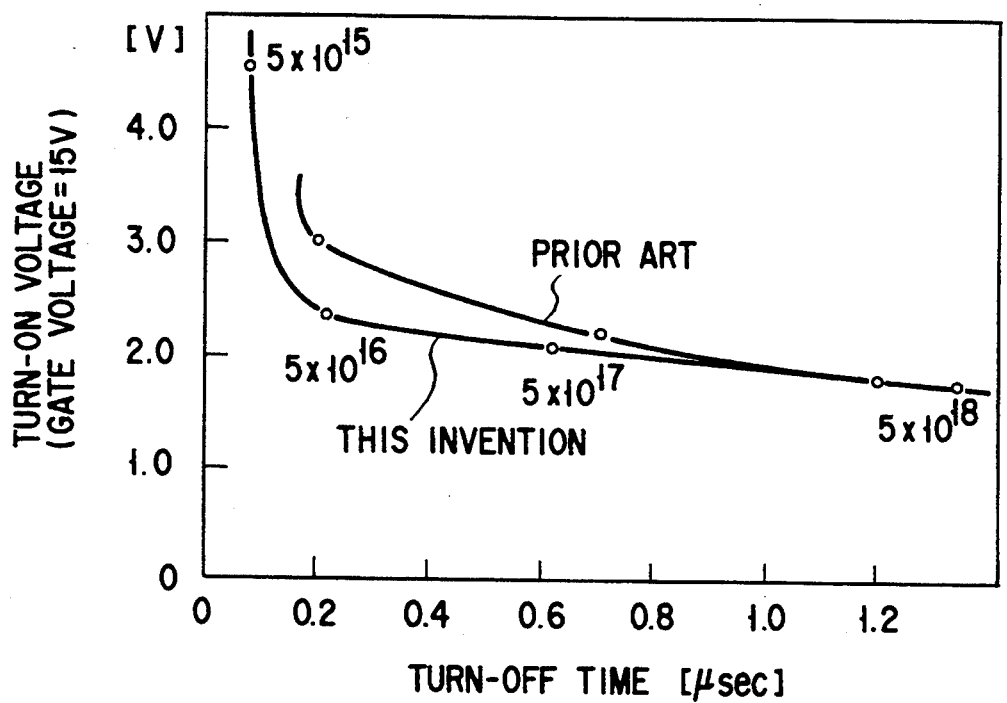
FIG. 14 is a characteristics diagram representing the relationship which between a turn-on voltage and a turn-off time in a conventional IGBT and in the IGBT of FIG. 1, as the impurity concentration of the $P^{31}$ anode region was changed.

How the turn-on voltage and turn-off time of the IGBT shown in FIG. 1 depend upon the impurity concentration of the P⁻ anode region 11 will be explained, with reference to FIG. 14. FIG. 14 is a diagram representing the relationship between the turn-on voltage and the turn-off time when the impurity concentration of the P⁻ anode region was changed from $5 \times 10^{15}$ to $5 \times 10^{18}$ cm⁻³, in a conventional IGBT and in the IGBT shown in FIG. 1. The turn-on voltage (V) is plotted on the ordinate, and the turn-off time (μsec) on the abscissa.

As is evident from FIG. 14, the lower the impurity concentration of the P⁻ anode region 11, the lower the turn-on voltage, but the longer the turn-off time. Operating frequencies of ordinary inverters range from several kHz to tens of kHz, and each inverter should generate but as little heat as possible. In view of this, it is required that the IGBT have a turn-off time of 1 μsec or less and a turn-on voltage of 4 V or less. From FIG. 14, it is understood that the impurity concentration of the P⁻ anode region 11 should fall within the range from about $1 \times 10^{16}$ cm⁻³ to about $1 \times 10^{17}$ cm⁻³. Therefore, the impurity concentration of the anode region 11 is set at any value within this specific range to adjust both the turn-on voltage and the turn-off time to any appropriate values.

Figure 15:
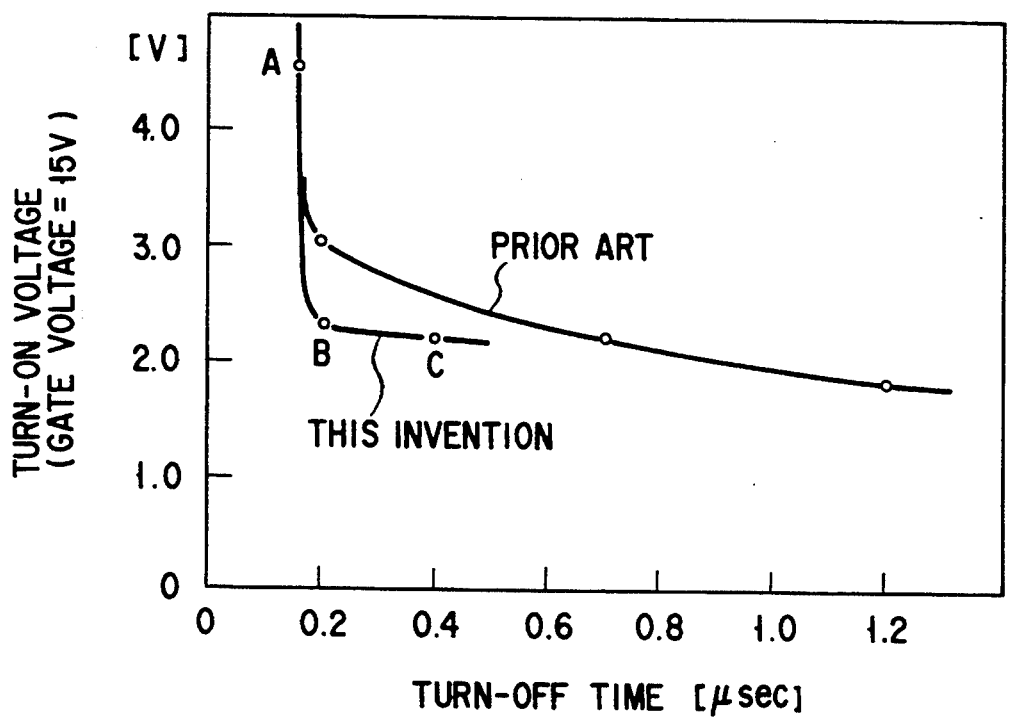
FIG. 15 is a characteristics diagram showing the relationship between a turn-on voltage and a turn-off time in a conventional IGBT and in the IGBTs of FIGS. 1 and 7, as the area ratio between the P+ and P− anode regions was changed.

How the turn-on voltage and turn-off time of the IGBTs shown in FIGS. 1 and 7 depend upon the area ratio between the P⁺ anode region 21 and the P⁻ anode region 11 will be explained, with reference to FIG. 15. FIG. 15 is a diagram showing the relationship between the turn-on voltage and turn-off time as said area ratio was changed in a conventional IGBT and in the IGBTs of FIGS. 1 and 7. The turn-on voltage (V) is plotted on the ordinate, and the turn-off time (μsec) on the abscissa.

In FIG. 15, point A indicates the relationship between the turn-on voltage and the turn-off time when the area ratio was 0:1. This is the case where the P⁺ anode region 21 was not formed at all, whereas the P⁻ anode region 11 was formed on the entire surface of the N⁻ drain region 12. Point B represents the relationship between the turn-on voltage and the turn-off time when the area ratio was 1:1. This is the case where both anode regions 21 and 11 were each formed on an entire surfaces of the N⁻ drain region 12. Finally, point C indicates the relationship between the turn-on voltage and the turn-off time when the area ratio was 1:0. This then is, when the P⁺ anode region 21 was formed on the entire surface of the N⁻ drain region 12, whereas the P⁻ anode region 11 was not formed at all. In each of the above three cases, the P⁻ anode region 11 had an impurity concentration of about $5 \times 10^{16}$ cm⁻³.

As is seen from FIG. 15, the smaller the P⁺ anode region 21, the higher the turn-on voltage, and the greater the characteristics difference among IGBTs. In the case where the P⁻ anode region 11 was not formed at all, the turn-on voltage is low, but the turn-off time is about 0.4 μsec, disabling the IGBT to respond to high frequencies. Hence, to maintain the turn-on voltage sufficiently low and to make the turn-off time shorter than 0.4 μsec, it suffices to set the ratio of the area of the P⁺ anode region 21 to that of the P⁻ anode region 11 at less than 1.

The embodiments described above are N-channel IGBTs. Nonetheless, the present invention can be applied to P-channel IGBTs and any other types of conductivity-modulated semiconductor devices. Furthermore, the material of the anode electrode 19 is not limited to Au, but can also be Ti, Al, Pt, W, Mo, and the like. If the electrode 19 is made of Al, the Al must be heat-treated to become stable. Still further, the material of the gate 16 is not limited to polycrystalline silicon, but may also be silicide or polycide. Finally, the substrate 1 made of silicon may be replaced by any other type of a semiconductor substrate.

What is claimed is:

1. A conductivity-modulated semiconductor device comprising:
   a semiconductor substrate of a first conductivity type having first and second major surfaces and functioning as a drain region;
   a plurality of base regions of a second conductivity type, formed within said first major surface of said semiconductor substrate and spaced apart from one another;

a plurality of source regions of said first conductivity type, formed in each of said plurality of base regions and spaced apart from one another;

a plurality of gate insulating films, each of said plurality of gate insulating films being formed on a portion of said drain region which is located between successive base regions;

a plurality of gates, each one of said plurality of gates being formed on each of said plurality of gate insulating films;

a plurality of source electrodes, each one of said plurality of source electrodes short-circuiting one of said plurality of base regions to said plurality of source regions formed therein;

a first anode region of said second conductivity type which contacts said second major surface of said semiconductor substrate;

a second anode region of said second conductivity type formed on said first anode region and comprised of polycrystalline silicon of said second conductivity type, said second anode region having an impurity concentration higher than that of said first anode region; and an anode electrode formed on said second anode region.

2. A conductivity-modulated semiconductor device according to claim 1, further comprising a buffer layer of said first conductivity type interposed between said drain region and said first anode region.

3. A conductivity-modulated semiconductor device according to claim 1, wherein said first anode region is formed of a semiconductor substrate of said second conductivity type bonded to said semiconductor substrate of said first conductivity type.

4. A conductivity-modulated semiconductor device according to claim 1, wherein said first anode region is formed substantially within said second major surface of said semiconductor substrate, and said second anode region substantially contacts the entire first anode region.

5. A conductivity-modulated semiconductor device according to claim 1, wherein said first anode region is formed within a part of said second major surface of said semiconductor substrate, and said second anode region contacts both said first anode region and said drain region.

6. A conductivity-modulated semiconductor device according to claim 5, wherein a turn-off time thereof is shortened by increasing a ratio of an area wherein said second anode region contacts said first anode region to an area wherein said second anode region contacts said drain region, and a turn-on voltage thereof is lowered by decreasing said ratio.

7. A conductivity-modulated semiconductor device according to claim 1, wherein said first anode region has an impurity concentration within a range of $1 \times 10^{16}$ to $1 \times 10^{18}$ cm$^{-1}$, and said second anode region has an impurity concentration within a range of $1 \times 10^{18}$ to $1 \times 10^{20}$ cm$^{-3}$.

8. A conductivity-modulated semiconductor device according to claim 7, wherein a turn-off time thereof is shortened by decreasing said impurity concentration of said second anode region, and a turn-on voltage thereof is lowered by increasing said impurity concentration of said second anode region.

9. A conductivity-modulated semiconductor device according to claim 1, wherein said second anode region has a thickness within a range of 0.1 to 1.0 μm.

* * * * *